United States Patent
Mori (10) Patent No.: US 11,224,920 B2
(45) Date of Patent: Jan. 18, 2022

(54) COATED TOOL

(71) Applicant: KYOCERA CORPORATION, Kyoto (JP)

(72) Inventor: Satoshi Mori, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 798 days.

(21) Appl. No.: 16/065,190

(22) PCT Filed: Dec. 22, 2016

(86) PCT No.: PCT/JP2016/088472
§ 371 (c)(1),
(2) Date: Jun. 22, 2018

(87) PCT Pub. No.: WO2017/111073
PCT Pub. Date: Jun. 29, 2017

(65) Prior Publication Data
US 2019/0017178 A1    Jan. 17, 2019

(30) Foreign Application Priority Data

Dec. 22, 2015 (JP) .............................. JP2015-249948

(51) Int. Cl.
*B23B 27/14* (2006.01)
*C23C 14/32* (2006.01)
(Continued)

(52) U.S. Cl.
CPC .............. *B23B 27/14* (2013.01); *B23B 51/00* (2013.01); *B23C 5/16* (2013.01); *C23C 14/0641* (2013.01);
(Continued)

(58) Field of Classification Search
CPC ... B23B 27/14; B23B 27/148; C23C 14/0641; C23C 14/0664; C23C 28/044
(Continued)

(56) References Cited

U.S. PATENT DOCUMENTS

| 2009/0317659 A1* | 12/2009 | Yamamoto | ............ C23C 28/048 |
| | | | 428/655 |
| 2010/0189835 A1* | 7/2010 | Yamamoto | .......... C23C 14/0635 |
| | | | 428/457 |

(Continued)

FOREIGN PATENT DOCUMENTS

| JP | H11302832 A | 11/1999 |
| JP | 2010076084 A | 4/2010 |

(Continued)

*Primary Examiner* — Archene A Turner
(74) *Attorney, Agent, or Firm* — Viering, Jentschura & Partner MbB (57) ABSTRACT

A coated tool may include a base member and a coating layer located on the base member. The coating layer may include an alternating layer having first layers and second layers. The first layers may contain $(Ti_bNb_dM_e)C_xN_{1-x}$ (where M is one or more kinds selected from metals of Groups 4, 5 and 6 in the periodic table except for Ti and Nb, and Al, $0.2 \leq b \leq 0.8$, $0.01 \leq d \leq 0.2$, $0 \leq e \leq 0.7$, $b+d+e=1$ and $0<x<1$). The second layers may contain M'N (where M' is metal of Groups 4, 5 and 6 in the periodic table except for Nb).

12 Claims, 5 Drawing Sheets (51) Int. Cl.
    *C23C 14/06*           (2006.01)
    *B23B 51/00*          (2006.01)
    *B23C 5/16*            (2006.01)
    *C23C 28/04*          (2006.01)

(52) U.S. Cl.
    CPC ........ *C23C 14/0664* (2013.01); *C23C 14/325* (2013.01); *C23C 28/044* (2013.01); *C23C 14/0635* (2013.01)

(58) Field of Classification Search
    USPC .......... 51/307, 309; 407/119; 428/216, 336, 428/697, 698, 699
    See application file for complete search history.

(56) References Cited

U.S. PATENT DOCUMENTS

| | | | |
|---|---|---|---|
| 2011/0188950 A1* | 8/2011 | Ahlgren | ............. C23C 14/0021 407/119 |
| 2013/0022419 A1 | 1/2013 | Sakamoto et al. | |
| 2013/0071620 A1 | 3/2013 | Waki et al. | |

FOREIGN PATENT DOCUMENTS

| | | |
|---|---|---|
| JP | 2013023745 A | 2/2013 |
| WO | 2011122554 A1 | 10/2011 |

\* cited by examiner

COATED TOOL

CROSS-REFERENCE TO RELATED APPLICATIONS

This application is a national stage entry according to 35 U.S.C. 371 of PCT Application No. PCT/JP2016/088472 filed on Dec. 22, 2016, which claims priority to Japanese Application No. 2015-249948 filed on Dec. 22, 2015, which are entirely incorporated herein by reference.

TECHNICAL FIELD

The present disclosure relates to a coated tool.

BACKGROUND

As a coated tool used for cutting, a coated tool has been known which includes, for example, a hard base member composed of WC-based cemented carbide or TiCN-based cermet, and various coating layers located on a surface of the hard base member. Although a TiCN layer and a TiAlN layer are generally employed as the coating layers in this coated tool, different coating layers are developed for the purpose of improving wear resistance and fracture resistance.

For example, Japanese Unexamined Patent Publication No. 11-302832 (Patent Document 1) discloses a coating layer whose lower layer is a TiAlN layer and whose upper layer is a TiNbAlN layer. Japanese Unexamined Patent Publication No. 2010-076084 (Patent Document 2) discloses a coating layer having a configuration in which layers A composed of TiNbSiN and layers B composed of TiAlN are laminated alternately.

Recently, there is a need to further enhance the wear resistance and fracture resistance of the coating layers in the technical field of coated tools.

SUMMARY

A coated tool in a non-limiting embodiment includes a base member and a coating layer located on the base member. The coating layer includes an alternating layer having first layers and second layers laminated alternately. The first layers contain $(Ti_b Nb_d M_e)C_x N_{1-x}$ (where M is one or more kinds selected from metals of Groups 4, 5 and 6 in the periodic table except for Ti and Nb, and Al, $0.2 \leq b \leq 0.8$, $0.01 \leq d \leq 0.2$, $0 \leq e \leq 0.7$, $b+d+e=1$ and $0<x<1$). The second layers contain M'N (where M' is metal of Groups 4, 5 and 6 in the periodic table except for Nb).

DETAILED DESCRIPTION (Coated Tool)

A coated tool 1 in one of embodiments is described with reference to FIGS. 1 and 2.

Figure 1:
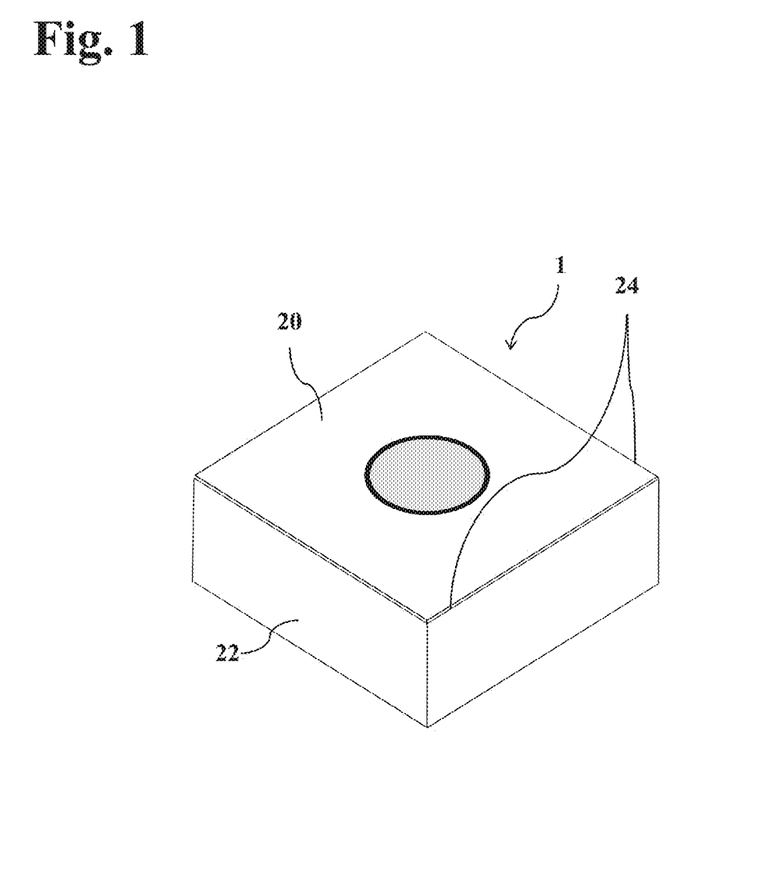
FIG. 1 is a schematic perspective view of a coated tool in one of embodiments.

The coated tool 1 illustrated in FIG. 1 includes a first surface 20, a second surface 22, and a cutting edge 24 located in at least a part of an intersecting region of the first surface 20 and the second surface 22. The coated tool 1 illustrated in FIG. 1 is one of embodiments of exchangeable cutting inserts which is usable by being attached to a predetermined position of a front end of a holder (not illustrated).

The first surface 20 is illustrated as an upper surface in FIG. 1, and at least a part of the first surface 20 is a rake surface. The second surface 22 is illustrated as a side surface in FIG. 1, and at least a part of the second surface 22 is a flank surface. There is no problem even if at least a part of the first surface 20 is a flank surface and at least a part of the second surface 22 is a rake surface.

Figure 2:
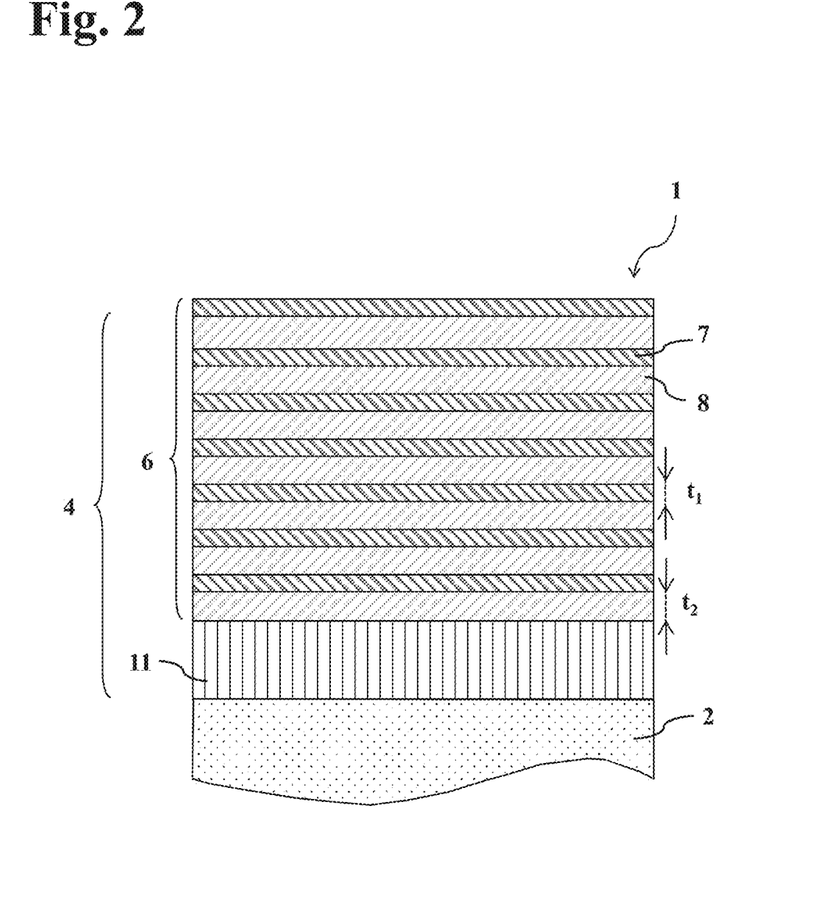
FIG. 2 is a schematic diagram illustrating in enlarged dimension the vicinity of a coating layer in the coated tool in FIG. 1.

The coated tool 1 also includes a base member 2 and a coating layer 4 located on the base member 2 as illustrated in FIG. 2. The coating layer 4 includes an alternating layer 6 having first layers 7 and second layers 8 laminated alternately in the present embodiment. The first layers 7 contain $(Ti_b Nb_d M_e)C_x N_{1-x}$ (where M is one or more kinds selected from metals of Groups 4, 5 and 6 in the periodic table except for Ti and Nb, and Al, $0.2 \leq b \leq 0.8$, $0.01 \leq d \leq 0.2$, $0 \leq e \leq 0.7$, $b+d+e=1$ and $0<x<1$). The second layers 8 contain M'N (where M' is metal of Groups 4, 5 and 6 in the periodic table except for Nb). When a combination of the first layers 7 and the second layers 8 is taken as a set, the alternating layer 6 includes two sets or more. The alternating layer 6 may include five sets or more.

The first layers 7 have high hardness and oxidation resistance because of the above composition. The second layers 8 have high toughness because of the above composition. The first layers 7 are compatible with the second layers 8 in the present embodiment, thus leading to good joining properties. Hence, the coated tool 1 has a long life because the alternating layer 6 is excellent in wear resistance and fracture resistance.

Micro-Vickers hardness of the alternating layer 6 in the present embodiment is 25 GPa or more. Micro-Vickers hardness is measured under a load of 20 mN by a nanoindenter.

With the present embodiment, the alternating layer 6 includes a plurality of first layers 7 and a plurality of second layers 8. Each of an average value of thicknesses $t_1$ of the first layers 7 and an average value of thicknesses $t_2$ of the second layers 8 is 1-100 nm. A well balance between wear resistance and fracture resistance is established within this range. The average value of thicknesses $t_1$ of the first layers 7 is, for example, 10-50 nm. The average value of thicknesses $t_2$ of the second layers 8 is, for example, 12-100 nm.

As used herein, the average value of thicknesses $t_1$ of the first layers 7 denotes a value obtained by measuring the thickness of each of the first layers 7 and by dividing a sum of measured thicknesses by the number of the layers. This is also true for the second layers 8. A measurement object for the average value of thicknesses $t_1$ of the first layers 7 and the average value of thicknesses $t_2$ of the second layers 8 may be the first surface 20 or the second surface 22 when the measurements are carried out before a cutting process, but the measurement object after the cutting process needs to be a surface serving as a flank surface.

A total thickness of the alternating layer 6 is, for example, 0.5-3 μm. When the total thickness of the alternating layer 6 is 0.5-3 μm, the alternating layer 6 has high fracture resistance, and has high fracture resistance because internal stress of the alternating layer 6 does not become too high.

With regard to the average value of thicknesses $t_1$ of the first layers 7 and the average value of thicknesses $t_2$ of the second layers 8, the average value of thicknesses $t_2$ of the second layers 8 may be greater than the average value of thicknesses $t_1$ of the first layers 7. In this case, the internal stress of the alternating layer 6 is relaxed, and the alternating layer 6 tends to become thicker without causing peeling or chipping.

A ratio $t_1/t_2$ of the average value of thicknesses $t_1$ of the first layers 7 to the average value of thicknesses $t_2$ of the second layers 8 may be 0.6-0.9. In this case, the alternating layer 6 further tends to become thicker.

The first layers 7 are described below. In terms of a composition of $(Ti_bNb_dM_e)C_xN_{1-x}$ of the first layers 7, the first layers 7 have high hardness because b is 0.2 or more, and the coating layer 4 has high wear resistance because b is 0.8 or less. The alternating layer 6 has high oxidization resistance and the coating layer 4 has high heat resistance because d is 0.01 or more. The alternating layer 6 has high hardness because d is 0.2 or less.

The metal M in the first layers 7 are composed of one or more kinds selected from the metals of Groups 4, 5 and 6 in the periodic table except for Ti and Nb, and Al. When the first layers 7 contain, among others, Al as the metal M, the hardness and oxidization resistance of the alternating layer 6 can be improved. Besides the above, when the first layers 7 contain one or more kinds selected from Cr and W, the oxidization resistance of the alternating layer 6 can be enhanced.

The second layers 8 are described below. In terms of a composition of M'N of the second layer s8 (where M' is metal of Groups 4, 5 and 6 in the periodic table except for Nb), particularly when the second layers 8 contain, as M', at least one of Ti, Cr, and W, the toughness of the second layers 8 are improvable, and the fracture resistance of the coating layer 4 is improvable. Particularly when M' is Ti, specifically, the second layers 8 are composed of TiN, the second layers 8 have small internal stress and thereby relaxes the internal stress of the alternating layer 6. The alternating layer 6 is therefore less prone to peeling off or chipping from the base member 2 due to self-destruction, thus leading to improved wear resistance and fracture resistance.

Although M' is the metal of Groups 4, 5 and 6 in the periodic table except for Nb, it does not mean that the second layers 8 contain no Nb. Because the second layers 8 and the first layers 7 are laminated alternately, Nb in the first layers 7 may diffuse into the second layers 8. Therefore, the second layers 8 may slightly contain Nb at a ratio of approximately ¹⁄₁₀ or less relative to a content ratio d of Nb in the first layers 7.

A content ratio of each element in the alternating layer 6 is measurable using an energy dispersive X-ray spectrometry (EDS) analyzer included in an electron microscope measuring instrument. Here, it may be difficult to accurately measure a peak of Lα ray of Ti (the vicinity of energy 0.4 keV) in an EDS analysis method due to overlapping with a peak of Kα ray of N (nitrogen). Therefore, when there is a possibility that N is contained, a content of Ti needs to be found by using a peak of Kα ray of Ti (the vicinity of energy 4.5 keV) instead of the peak of the Lα ray of Ti. In measurements of the metal M and the metal M', it is necessary to measure at arbitrary five or more locations of the coating layer 4. Their average values of the measured values need to be respectively evaluated as the content of the metal M and the content of the metal M'.

Examples of material of the base member 2 include cemented carbide, cermet, ceramics, ultra-high pressure sintered body, and steel. Examples of the cemented carbide and the cermet include ones made up of a hard phase composed mainly of tungsten carbide and/or titanium carbonitride, and a binding phase composed mainly of iron group metals such as cobalt and nickel. Examples of the ceramics include ones composed mainly of silicon nitride or aluminum oxide. Examples of the ultra-high pressure sintered body include hard materials obtained by sintering, under ultra-high pressure, a hard phase composed of polycrystalline diamond or cubic boron nitride (cBN) and a binding phase composed of ceramics and iron family metal.

The coating layer 4 may include an intermediate layer 11 located between the alternating layer 6 and the base member 2. The intermediate layer 11 contains a TiN layer or CrN layer having a thickness of 0.1-1 μm. This configuration contributes to improving adhesion of the alternating layer 6 to the base member 2, and the alternating layer is therefore less prone to peeling. In particular, when the base member 2 contains cBN, the coating layer 4 including the intermediate layer 11 is effective. A thickness of the intermediate layer 11 may be greater than each of a thickness of a plurality of first layers 7 and a thickness of a plurality of second layers 8. With this configuration, the alternating layer 6 is further surely less prone to peeling.

Alternatively, one of the second layers 8 may be adjacent to the intermediate layer 11. This configuration contributes to enhancing joining properties between the alternating layer 6 and the intermediate layer 11 than when one of the first layers 7 is adjacent to the intermediate layer 11. This is because the second layers 8 represented by the composition of M'N are more likely to be joined to the intermediate layer 11 than the first layers 7 represented by the composition of $(Ti_bNb_dM_e)C_xN_{1-x}$.

When the base member 2 contains TiC or TiN in the presence of the intermediate layer 11, it is possible to enhance the effect of reducing peeling of the alternating layer 6 due to the intermediate layer 11, thus leading to improved adhesion.

A surface layer (not illustrated) composed of TiN or CrN may be located on the alternating layer 6 (a position away from the base member 2). When the coating layer 4 includes the surface layer, it is possible to set a color of the coating layer 4 to a color that makes it easier to check use, and it is also possible to enhance sliding properties of the coating layer 4.

Although the above embodiment has described the coated tool 1 having the approximately plate shape, the present embodiment is not limited thereto but applicable to those having a shape other than the approximately plate shape. The coated tool 1 is also applicable to drills, end mills, reamers, taps, or edged tools. Furthermore, the coated tool 1 is also applicable to purposes other than cutting, for example, wear resistant members such as metal molds, and digging tools.

Modified Embodiments

Modified embodiments of the coated tool 1 of the above embodiment are described below with reference to the drawings. The following description is focused on points in which the modified embodiments differ from the coated tool 1 of the above embodiment, and descriptions of similarities between the coated tool 1 of the above embodiment and those of the modified embodiments are omitted here.

Although the above embodiment illustrates the embodiment in which the thickness of each of the first layers 7 and the thickness of each of the second layers 8 are approximately constant in the coated tool 1 illustrated in FIG. 2, the configuration of the alternating layer 6 is not limited to the above. The first to third modified embodiments are described below.

Figure 3:
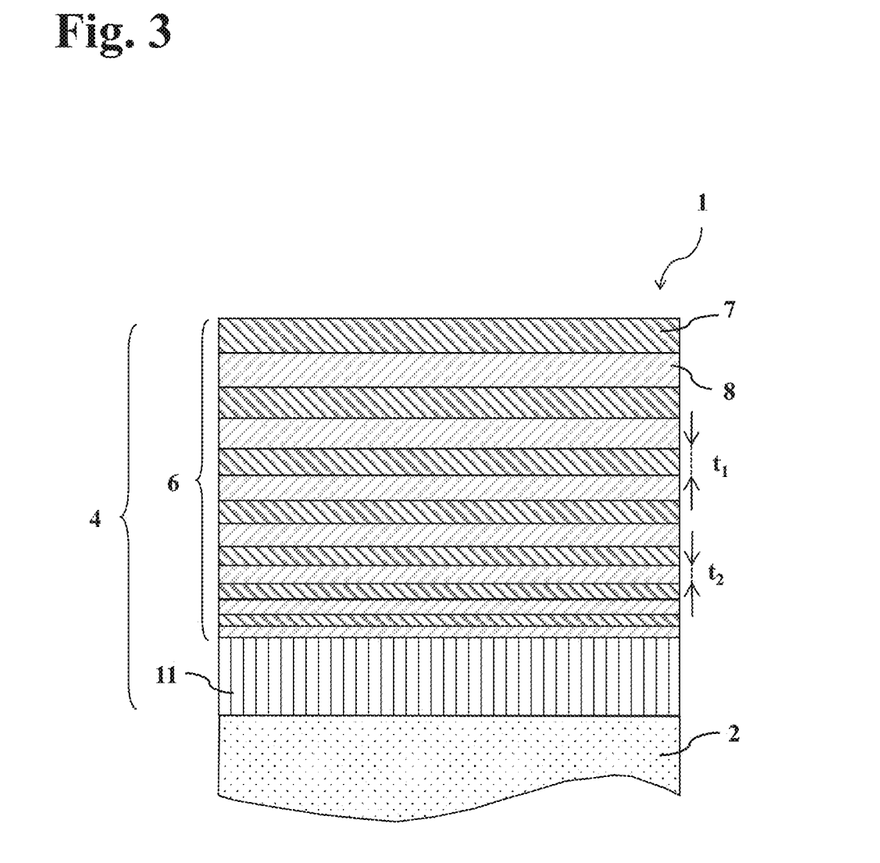
FIG. 3 is a schematic diagram illustrating in enlarged dimension the vicinity of a coating layer in a coated tool in a first modified embodiment.

A thickness of one of a plurality of first layers 7 which is located most away from the base member 2 is greater than those of other first layers 7 in the first modified embodiment as illustrated in FIG. 3. The thick first layer 7 is located at a position most away from the base member 2 in the alternating layer 6. When the alternating layer 6 has the above configuration, the first layer 7, which is located closest to a workpiece during a cutting process, and which is susceptible to a local load concentration due to the cutting process, has the great thickness. Consequently, the durability of the coating layer 4 is enhanced, thus leading to enhanced wear resistance of the coating layer 4.

Figure 4:
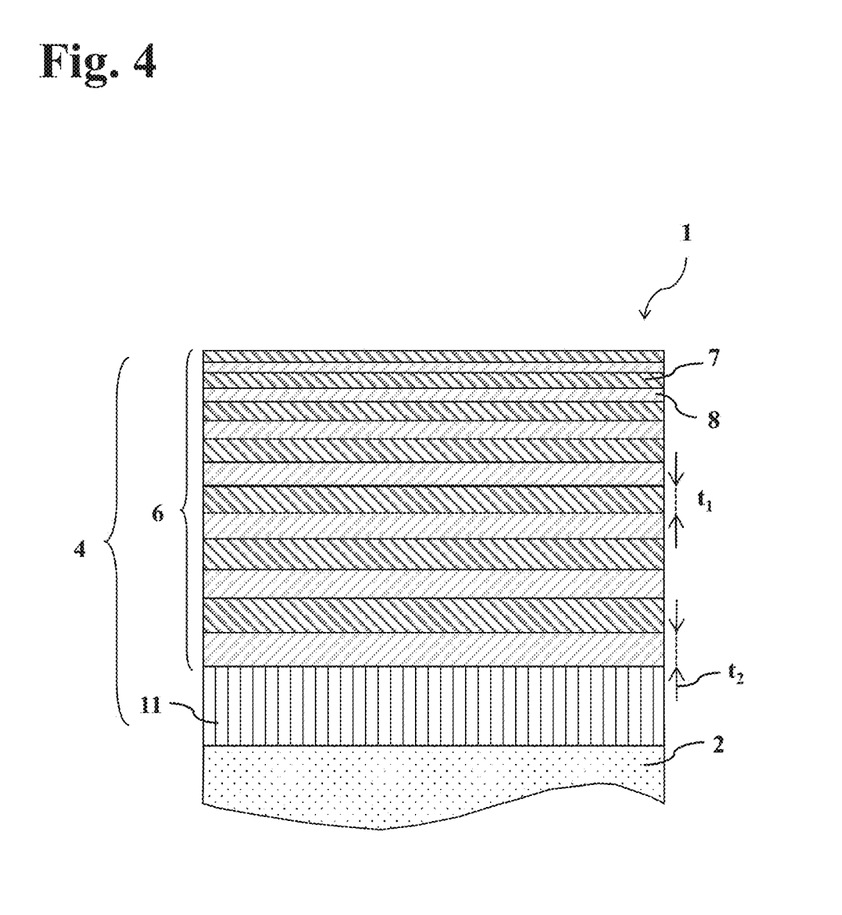
FIG. 4 is a schematic diagram illustrating in enlarged dimension the vicinity of a coating layer in a coated tool in a second modified embodiment.

A thickness of one of a plurality of first layers 7 which is located closest to the base member 2 may be greater than those of other first layers 7 in the second modified embodiment as illustrated in FIG. 4. The first layers 7 have higher fracture resistance with increasing thickness. With the above configuration, the first layer 7 located closest to the base member 2 has the high fracture resistance. Therefore, even when a part of a surface side in the alternating layer 6 is partially fractured, the first layer 7 located closest to the base member 2 is less prone to fracture, and it is easy to avoid that almost all of the alternating layer 6 is fractured at once. This contributes to enhancing the durability of the coating layer 4.

A thickness of one of a plurality of second layers 8 which is located closest to the base member 2 may be greater than those of other second layers 8 in the second modified embodiment as illustrated in FIG. 4. The second layers 8 has higher fracture resistance with increasing thickness. With the above configuration, the second layer 8 located closest to the base member 2 has the high fracture resistance. Therefore, even when a part of the surface side in the alternating layer 6 is partially fractured, the second layer 8 located closest to the base member 2 is less prone to fracture, and it is easy to avoid that almost all of the alternating layer 6 is fractured at once. This contributes to enhancing the durability of the coating layer 4.

Figure 5:
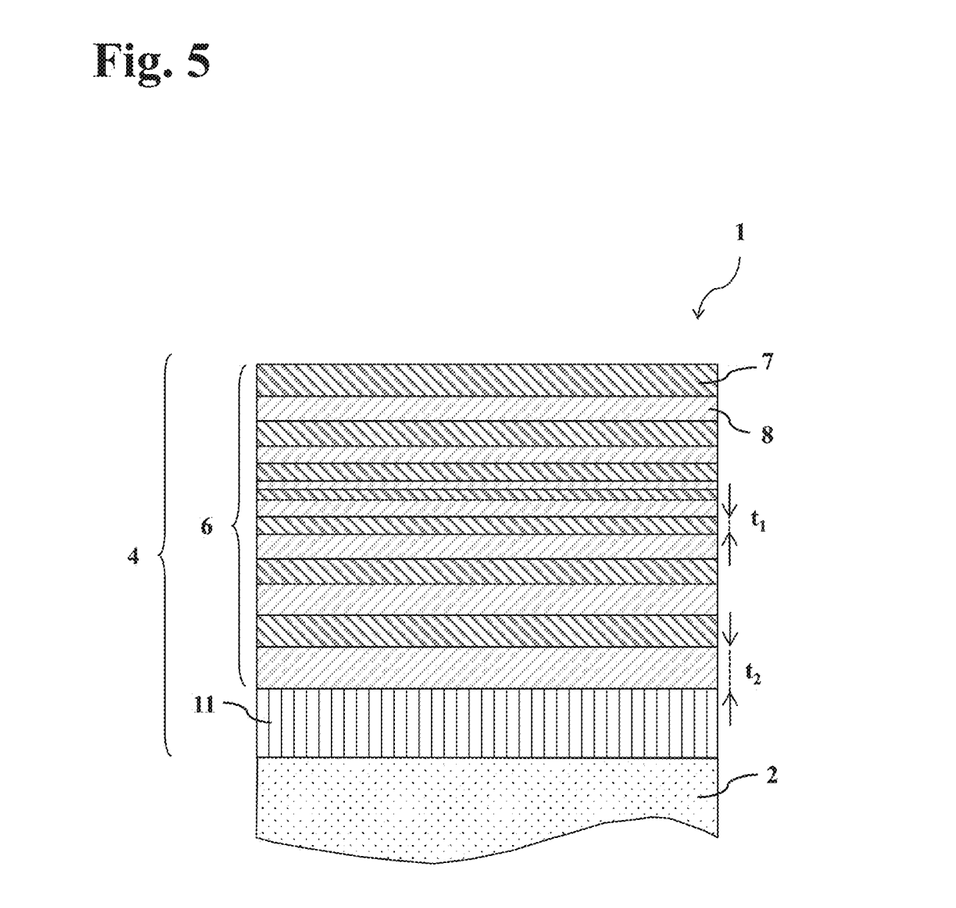
FIG. 5 is a schematic diagram illustrating in enlarged dimension the vicinity of a coating layer in a coated tool in a third modified embodiment.

From the viewpoint of enhancing the wear resistance and durability of the coating layer 4, the alternating layer 6 may be made into a configuration in the third modified embodiment as illustrated in FIG. 5. Of a plurality of first layers 7 in the third modified embodiment, the first layer 7 located closest to the base member 2 has a greatest thickness, and the first layer 7 located most away from the base member 2 has a second greatest thickness. Specifically, the thickness of the first layer 7 located closest to the base member 2 of a plurality of first layers 7 is greater than those of other first layers 7. The thickness of the first layer 7 located most away from the base member 2 of the plurality of first layers 7 is greater than those of other first layers 7 except for the first layer 7 located closest to the base member 2. This configuration contributes to enhancing the wear resistance and durability of the coating layer 4.

The configuration of the plurality of first layers 7 in the third modified embodiment can be rephrased as follows. These first layers 7 in the third modified embodiment include the first layer 7 located closest to the base member 2, and have a region in which thicknesses of the first layers 7 decrease as going away from the base member 2, and a region which is located further away from the base member 2 than the foregoing region, and in which thicknesses of the first layers 7 increase as going away from the base member 2. This configuration contributes to enhancing the wear resistance and durability of the coating layer 4.

(Manufacturing Method)

A method of manufacturing the coated tool in the present embodiment is described below.

The base member 2 having a tool shape is manufactured with a conventional well-known method. Subsequently, the coating layer 4 is deposited on a surface of the base member 2. Physical vapor deposition (PVD) method, such as ion plating method and sputtering method, is suitably applicable to a method of depositing the coating layer 4.

When the coating layer 4 is manufactured with ion plating method, the following is an example of deposition methods. Firstly, as targets constituting the first layers 7, a first target is prepared which contains metallic titanium (Ti), metallic niobium (Nb), metal M, and carbon. As a target constituting the second layers 8, a second target containing metal M' is prepared.

The first target constituting the first layers 7 and the second target constituting the second layers 8 are placed on a side wall surface of a chamber of a deposition apparatus. The first target and the second target are may be placed at opposite positions with the base member 2 interposed therebetween. Deposition is carried out while rotating the base member 2 under the following deposition conditions. That is, the alternating layer 6 can be deposited by alternating deposition of the first layers 7 and the second layers 8 on the surface of the base member 2, specifically, by reaction with nitrogen gas ($N_2$) of a nitrogen source at the same time that a metal source is vaporized and ionized by an arc discharge and a glow discharge. The thicknesses of the first layers 7 and the second layers 8 can be controlled by carrying out the deposition while rotating the base member 2 at 2-10 rpm.

Here, the first layers 7 containing carbon are deposited because the first target contains carbon. The second layers 8 containing little carbon are deposited because the second target contains no carbon. Even when the second target contains no carbon, the second layers 8 may contain inevitable carbon that diffuses from the first layers 7 because the first target contains carbon.

When the coating layer 4 is deposited with ion plating method or sputtering method, a specific high-hardness coating layer 4 can be manufactured by an arc current application taking a crystal structure of the coating layer 4 into consideration. Here, adhesion between the base member 2 and the coating layer 4 can be enhanced by an application of a bias voltage of 30-200 V.

When the intermediate layer 11 is deposited, a third target for depositing the intermediate layer 11 is prepared. The third target contains Ti or Cr. The intermediate layer 11 can be deposited by placing the third target on a side wall surface of the chamber, and by carrying out deposition before depositing the alternating layer 6 under the same conditions as described above. When a metal ingredient of the intermediate layer 11 is the same as that of the second layers 8, the second target is also usable as the third target.

Example 1

An amount of 10 mass % of metallic cobalt (Co) powder and an amount of 0.6 mass % of chromium carbide ($Cr_3C_2$) powder were added to tungsten carbide (WC) powder having a mean particle diameter of 0.8 μm, and then mixed together, followed by molding and sintering. After this was subjected to a grinding process, a surface thereof was washed with alkali, acid, and distilled water in the order named, thereby manufacturing a base member composed of cemented carbide.

The above base member was set into an arc ion plating apparatus having therein the first target, the second target, and the third target presented in Table 1. Each sample was obtained by depositing the coating layer presented in Table 1 by heating the base member to 500° C. and by setting a rotational speed of the base member to 3-6 rpm and an arc current to 150 A. Deposition conditions were established so that $N_2$ gas was present in an atmosphere of a total pressure 4 Pa and a bias voltage was set to 35 V.

Using a scanning electron microscope (VE8800) and a transmission electron microscope, manufactured by KEYENCE CORPORATION, each of obtained samples was subjected to a structure observation to check crystals constituting the coating layer and a film thickness thereof. Compositions of the coating layer (the first layers, the second layers, and the intermediate layer) were calculated by carrying out a quantitative analysis of the composition of the coating layer at an accelerating voltage of 15 kV with ZAF method as one kind of EDS analysis methods by using an EDAX analyzer (AMETEK EDAX-VE9800) associated with the above microscope. In film thickness measurements, each of thicknesses of a plurality of first layers and a plurality of second layers within a field of view in which these layers are observable at a magnification that permits observation of each of the thicknesses of the first layers and the second layers. Further, the measurements of observation points in arbitrary three or more observation fields were carried out, and a thickness $t_1$ of one of the first layers and a thickness $t_2$ of one of the second layers were calculated by averaging measurement results. The intermediate layer was measured with the scanning electron microscope during the measurements of $t_1$ and $t_2$.

Each sample was subjected to a cutting test under the following cutting conditions. The results were presented in Table 2.

Cutting method: Shoulder cutting (milling process)
Workpiece: SKD11
Cutting speed: 150 m/min
Feed rate: 0.12 mm/tooth
Depth of Cut: horizontal depth of cut 10 mm, vertical depth of cut 3 mm
Cutting state: Dry
Evaluation method: Chipping state was measured after cutting for 10 minutes, and the number of processing during which a cutting process could be carried out continuously was evaluated.

TABLE 1

| | Target | | | Coating layer | | |
|---|---|---|---|---|---|---|
| Sample No. | First target | Second target | Third target | Intermediate layer | First layer | Second layer |
| 1 | TiNbAlC | Ti | Ti | TiN | $(Ti_{0.38}Nb_{0.11}Al_{0.01})C_{0.05}N_{0.95}$ | TiN |
| 2 | TiAl | Ti | Ti | TiN | $(Ti_{0.5}Al_{0.5})N$ | TiN |
| 3 | TiNbAl | Ti | Ti | TiN | $(Ti_{0.38}Nb_{0.11}Al_{0.51})N$ | TiN |
| 4 | TiNbAlC | TiAl | Ti | TiN | $(Ti_{0.38}Nb_{0.11}Al_{0.51})C_{0.05}N_{0.95}$ | $(Ti_{0.50}Al_{0.50})N$ |

TABLE 2

| | | | | | | Cutting result | |
|---|---|---|---|---|---|---|---|
| Sample No. | Thickness of intermediate layer (μm) | Total thickness of alternating layer (μm) | Film thickness (individual) nm $t_1$ | $t_2$ | Ratio $t_1/t_2$ | Number of processing (piece) | State of cutting edge |
| 1 | 0.5 | 1.5 | 30 | 50 | 0.6 | 1000 | Constant wear |
| 2 | 0.5 | 1.5 | 40 | 45 | 0.89 | 600 | Large crater wear |
| 3 | 0.5 | 1.5 | 38 | 40 | 0.95 | 500 | Large crater wear |
| 4 | 0.5 | 1.5 | 45 | 60 | 0.75 | 700 | Large chipping |

As apparent from Tables 1 and 2, in Sample No. 1 including an alternating layer, in which first layers composed of the above $(Ti_bNb_dM_e)C_xN_{1-x}$ and second layers composed of the above M'N were repeatedly arranged in an alternating manner, the cutting edge was in a constant wear state, and the number of processing was greater than those in Sample Nos. 2 to 4.

Example 2

An amount of 50 mass % of cubic boron nitride (cBN) powder having a mean particle diameter of 2 μm, an amount of 46 mass % of titanium nitride (TiN) powder, and an amount of 4 mass % of metallic aluminum (Al) powder were added and mixed together. This was sintered by an ultra-high pressure sintering apparatus under conditions of 1400° C. and 5 GPa. A base member composed of a cBN sintered body was manufactured by cutting out the obtained cBN sintered body and then soldering the cBN sintered body to corner parts of a base metal, followed by a polishing process.

Similarly to EXAMPLE 1, a coating layer having a configuration presented in Table 3 was deposited with arc ion plating method.

Similarly to EXAMPLE 1, film thicknesses of the coating layer of each sample ($t_1$, $t_2$, and an intermediate layer thickness) were checked and a quantitative analysis of the composition of the coating layer was carried out. Sample Nos. 5 to 13 were subjected to Micro-Vickers hardness measurement, and these samples had hardness of 25-25 GPa.

Obtained samples were subjected to a cutting test under the following conditions. The results were presented in Tables 3 and 4.
Cutting method: Outer diameter cutting (turning process)
Workpiece: SCM415H
Cutting speed: 150 m/min
Feed rate: 0.1 mm/rev
Depth of Cut: 0.2 mm
Cutting state: Dry
Evaluation method: Chipping state was measured after cutting for three minutes, and the cutting time during which the cutting process could be carried out was evaluated.

As apparent from Tables 3 and 4, Sample Nos. 5 to 13 including an alternating layer having first layers composed of the above $(Ti_bNb_dM_e)C_xN_{1-x}$ and second layers composed of the above M'N had longer processing time than Sample Nos. 14 and 15. In particular, Sample Nos. 5 to 12, in which the base member was composed of the cBN sintered body and the intermediate layer composed of TiN or CrN was present therein, had long processing time. Sample Nos. 5 to 10 whose intermediate layer had a thickness of 0.1-1 μm caused no peeling of the coating layer.

While the embodiments in the present disclosure have been described and illustrated above, the present disclosure is not limited thereto. It is, of course, possible to make any arbitrary ones insofar as they do not depart from the gist of the present disclosure.

DESCRIPTION OF THE REFERENCE NUMERALS 1 coated tool
2 base member
4 coating layer
6 alternating layer
7 first layers
8 second layers
11 intermediate layer

TABLE 3

| | Target | | | Coating layer | | |
|---|---|---|---|---|---|---|
| Sample No. | First target | Second target | Third target | Intermediate layer | First layer | Second layer |
| 5 | TiNbAlC | Ti | Ti | TiN | $(Ti_{0.38}Nb_{0.11}Al_{0.51})C_{0.05}N_{0.95}$ | TiN |
| 6 | TiNbAlCrC | Ti | Ti | TiN | $(Ti_{0.2}Nb_{0.1}Al_{0.53}Cr_{0.17})C_{0.1}N_{0.5}$ | TiN |
| 7 | TiNbAlVC | Ti | Ti | TiN | $(Ti_{0.3}Nb_{0.2}Al_{0.43}V_{0.01})C_{0.5}N_{0.5}$ | TiN |
| 8 | TiNbAlWC | Ti | Ti | TiN | $(Ti_{0.8}Nb_{0.01}Al_{0.11}W_{0.05})C_{0.8}N_{0.2}$ | TiN |
| 9 | TiNbAlC | TiCr | Ti | TiN | $(Ti_{0.38}Nb_{0.11}Al_{0.51})C_{0.05}N_{0.95}$ | $(Ti_{0.5}Cr_{0.3})N$ |
| 10 | TiNbAlC | Cr | Cr | CrN | $(Ti_{0.38}Nb_{0.11}Al_{0.51})C_{0.05}N_{0.95}$ | CrN |
| 11 | TiNbAlC | W | Cr | CrN | $(Ti_{0.38}Nb_{0.11}Al_{0.51})C_{0.05}N_{0.95}$ | WN |
| 12 | TiNbAlC | V | Ti | TiN | $(Ti_{0.38}Nb_{0.11}Al_{0.51})C_{0.05}N_{0.95}$ | VN |
| 13 | TiNbAlC | Ti | — | — | $(Ti_{0.38}Nb_{0.11}Al_{0.51})C_{0.05}N_{0.95}$ | TiN |
| 14 | TiAl | Ti | Ti | TiN | $(Ti_{0.5}Al_{0.5})N$ | TiN |
| 15 | TiNbAl | Ti | Ti | TiN | $(Ti_{0.38}Nb_{0.11}Al_{0.51})N$ | TiN |
| 16 | TiNbAlC | TiAl | Ti | TiN | $(Ti_{0.38}Nb_{0.11}Al_{0.51})C_{0.05}N_{0.95}$ | $(Ti_{0.5}Al_{0.5})N$ |

TABLE 4

| | Total | | Film thickness (individual) nm | | | Cutting result | |
|---|---|---|---|---|---|---|---|
| Sample No. | Thickness of intermediate layer (μm) | thickness of alternating layer (μm) | $t_1$ | $t_2$ | Ratio $t_1/t_2$ | Cutting time (min) | State of cutting edge |
| 5 | 0.5 | 1.5 | 30 | 50 | 0.6 | 30 | Constant wear |
| 6 | 0.5 | 1.5 | 35 | 50 | 0.7 | 27 | Constant wear |
| 7 | 0.5 | 1.5 | 35 | 50 | 0.7 | 25 | Large crater wear |
| 8 | 0.5 | 1.5 | 35 | 50 | 0.7 | 23 | Large crater wear |
| 9 | 1 | 1.5 | 35 | 50 | 0.7 | 21 | Fine chipping |
| 10 | 0.1 | 1.5 | 35 | 40 | 0.9 | 17 | Fine chipping |
| 11 | 0.05 | 3 | 50 | 50 | 1 | 16 | Peeling and Chipping |
| 12 | 2 | 0.5 | 20 | 45 | 0.4 | 15 | Peeling and Chipping |
| 13 | — | 1.5 | 35 | 70 | 0.5 | 12 | Peeling and Chipping |
| 14 | 0.5 | 1.5 | 40 | 45 | 0.9 | 7 | Fracutre caused by crater wear |
| 15 | 0.5 | 1.5 | 38 | 40 | 1 | 5 | Fracutre caused by crater wear |
| 16 | 0.5 | 1.5 | 45 | 60 | 0.8 | 8 | Large chipping |

The invention claimed is:

1. A coated tool, comprising:
   a base member; and
   a coating layer located on the base member, wherein
   the coating layer comprises an alternating layer comprising first layers and second layers laminated alternately, wherein the first layers comprise a composition represented by the formula $(Ti_bNb_dM_e)C_xN_{1-x}$ (where M is one or more kinds selected from metals of Groups 4, 5 and 6 in the periodic table except for Ti and Nb, and Al, $0.2 \leq b \leq 0.8$, $0.01 \leq d \leq 0.2$, $0 \leq e \leq 0.7$, $b+d+e=1$ and $0<x<1$), and the second layers consists of a composition represented by the formula M'N (where M' is metal of Groups 4, 5 and 6 in the periodic table except for Nb).

2. The coated tool according to claim 1, wherein an average value of thicknesses of the second layers is greater than an average value of thicknesses of the first layers.

3. The coated tool according to claim 2, wherein a ratio of the average value of thicknesses of the first layers to the average value of thicknesses of the second layers is 0.6-0.9.

4. The coated tool according to claim 1, wherein a thickness of one of a plurality of the first layers which is located closest to the base member is greater than a thickness of each of the plurality of the first layers other than the one of the plurality of the first layers.

5. The coated tool according to claim 1, wherein a thickness of one of a plurality of the second layers which is located closest to the base member is greater than a thickness of each of the plurality of the second layers other than the one of the plurality of the second layers.

6. The coated tool according to claim 1, wherein a thickness of one of a plurality of the first layers which is located furthest away from the base member is greater than a thickness of each of the plurality of the first layers other than the first layer located closest to the base member.

7. The coated tool according to claim 1, wherein the coating layer further comprises an intermediate layer located between the alternating layer and the base member and comprising a TiN layer or CrN layer having a thickness of 0.1-1 μm.

8. The coated tool according to claim 7, wherein a thickness of the intermediate layer is greater than a thickness of each of a plurality of the first layers and greater than a thickness of each of a plurality of the second layers.

9. The coated tool according to claim 7, wherein one of the second layers is adjacent to the intermediate layer.

10. The coated tool according to claim 1, wherein the base member is composed of a cBN sintered body.

11. The coated tool according to claim 1, wherein the second layers substantially consist of a composition selected from the group consisting of TiN, CrN, WN, and combinations thereof.

12. The coated tool according to claim 1, wherein the second layers substantially consist of TiN.

* * * * *

UNITED STATES PATENT AND TRADEMARK OFFICE
CERTIFICATE OF CORRECTION

PATENT NO. : 11,224,920 B2
APPLICATION NO. : 16/065190
DATED : January 18, 2022
INVENTOR(S) : Satoshi Mori It is certified that error appears in the above-identified patent and that said Letters Patent is hereby corrected as shown below:

In the Specification

Column 8
In Table 1 at Sample No. 1, the correct chemical composition of the "First layer" should be noted as $(Ti_{0.38} Nb_{0.11} Al_{0.51}) C_{0.05} N_{0.95}$, instead of the chemical composition of $(Ti_{0.38} Nb_{0.11} Al_{0.01}) C_{0.05} N_{0.95}$.

Column 9
In Table 3 the "First Layer" of Sample 7 should be noted as $(Ti_{0.3} Nb_{0.2} Al_{0.43} V_{0.07}) C_{0.5} N_{0.5}$ instead of the chemical composition noted as $(Ti_{0.3} Nb_{0.2} Al_{0.43} V_{0.01}) C_{0.5} N_{0.5}$. Sample 8 in Table 3 should be noted as $(Ti_{0.8} Nb_{0.01} Al_{0.11} W_{0.08}) C_{0.8} N_{0.2}$ instead of the chemical composition noted as $(Ti_{0.8} Nb_{0.01} Al_{0.11} W_{0.05}) C_{0.8} N_{0.2}$. Additionally in Sample 9 the "Second Layer" should be noted as $(Ti_{0.5}Cr_{0.5})N$ instead of the chemical composition noted as $(Ti_{0.5}Cr_{0.3})N$.

Signed and Sealed this
Twenty-first Day of February, 2023

*Katherine Kelly Vidal*

Katherine Kelly Vidal
*Director of the United States Patent and Trademark Office*